United States Patent [19]

Mayfield

[11] 4,417,198
[45] Nov. 22, 1983

[54] AVERAGE RESPONDING RMS INDICATING TYPE TRANSDUCER

[75] Inventor: Glenn A. Mayfield, West Lafayette, Ind.

[73] Assignee: Duncan Electric Company, Inc., Lafayette, Ind.

[21] Appl. No.: 297,520

[22] Filed: Aug. 31, 1981

[51] Int. Cl.³ .............................................. G05F 3/08
[52] U.S. Cl. ..................................... 323/315; 363/61; 363/126; 323/231
[58] Field of Search ............... 323/312, 315, 316, 231; 363/45, 46, 60, 61, 126; 328/26, 144; 330/288; 324/119

[56] References Cited

U.S. PATENT DOCUMENTS

| 3,281,689 | 10/1966 | Schneider et al. | 324/119 |
| 3,971,979 | 7/1976 | Mayfield | 323/315 |
| 4,156,276 | 5/1979 | Tanabe et al. | 363/126 |

FOREIGN PATENT DOCUMENTS

| 240736 | 2/1961 | Australia | 363/126 |
| 1806352 | 5/1970 | Fed. Rep. of Germany | 323/231 |

OTHER PUBLICATIONS

Electronic Design 24, p. 148, Nov. 22, 1975.

Primary Examiner—William H. Beha, Jr.
Attorney, Agent, or Firm—John R. Nesbitt

[57] ABSTRACT

Transducers of the average responding RMS indicating type are disclosed that are particularly useful for monitoring currents and voltages in a power distribution network. The transducer includes transformer, inductively compensated voltage divider, active filter and output amplifier circuits electrically connected to provide a transducer having excellent long term transducer stability so that the transducer requires no calibration, and a highly accurate readout over a wide temperature range.

23 Claims, 6 Drawing Figures

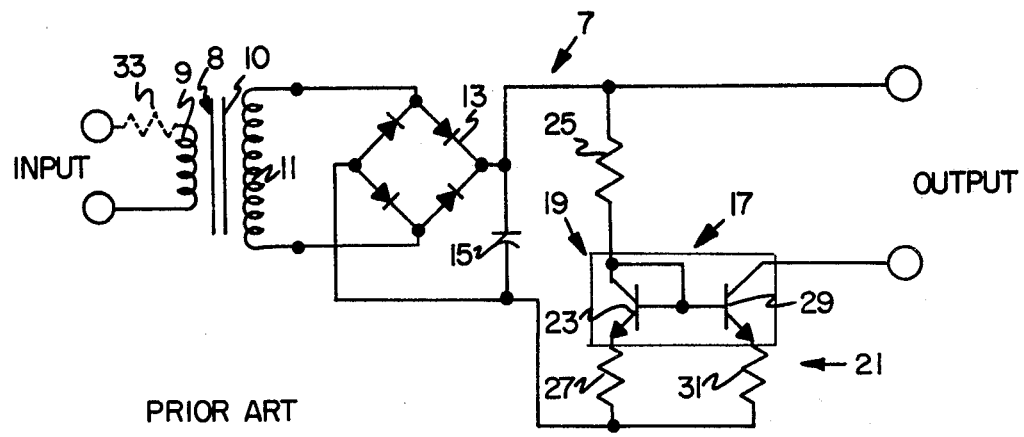
FIG. I
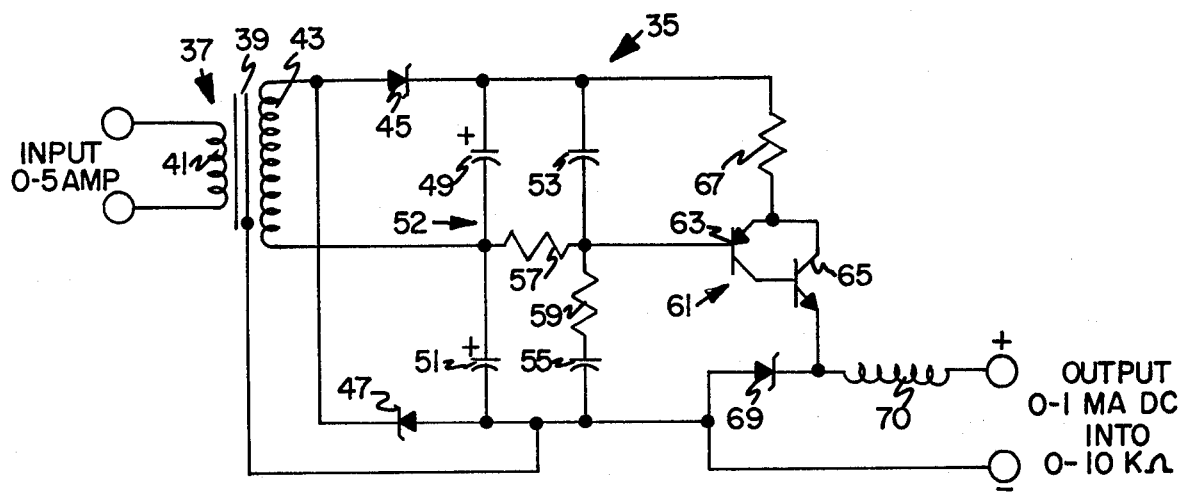
FIG. 2

AVERAGE RESPONDING RMS INDICATING TYPE TRANSDUCER

FIELD OF THE INVENTION

This invention relates to electronic signal transducers, and, more particularly, relates to transducers of the average responding RMS indicating type.

BACKGROUND OF THE INVENTION

Current and voltage transducers are known to be useful by utilities for monitoring and recording currents and voltages at various locations within their supervisory control systems, as well as being useful in other apparatus, including, for example, industrial control applications.

Typical current and voltage transducer devices now known have nominal inputs of 5 amperes and/or 120 volts and nominal outputs of 1 milliampere DC (current transducer) or 1 milliampere at 150 volts (voltage transducer), with most (over 90%) of such devices being of the average responding RMS indicating type. The average responding RMS indicating type of transducer responds to the average value of the AC signal rather than to the root means square value, but is calibrated such that the output signal corresponds to the root means square value of the input signal. In addition, such a transducer is more economical than true RMS devices and has proved to be quite satisfactory in fulfilling the majority of needs.

With respect to prior art patents, U.S. Pat. No. 3,971,979 is directed to a current/voltage transducer that includes a current mirror circuit having reference and output legs each of which includes at least one transistor and associated emitter and/or collector resistances.

In this type of device, the base emitter voltage of the reference transistor and output transistor directly enter into the transfer function and their drop affect the gain of the circuit, as does the emitter connected resistor. As a result, the circuit must be adjusted (as, for example, by a potentiometer included in the reference leg of the transducer shown in U.S. Pat. No. 3,971,979), and requires periodic recalibration due to changes in the values of components utilized.

Since the transistors and resistors in the circuit are connected to the secondary winding of the transformer, the values of these components influence the effective secondary resistance which is in series with the resistance in the primary winding circuit of the transformer for voltage transducers, which likewise affects calibration and calibration stability. In addition, the primary winding of a voltage transducer is normally made of copper the resistance of which changes due to temperature changes and this creates a temperature dependant factor in calibration of the device. The secondary winding is also temperature dependant to some degree and the available winding area on the core must be divided to optimize temperature drifts due to the copper windings.

SUMMARY OF THE INVENTION

This invention provides an improved electronic signal transducer of the average responding RMS indicating type that is particularly useful for monitoring current and voltage in a power distribution network. The transducer may be either a current transducer or a voltage transducer and provides a highly accurate readout with excellent long term stability so as to require no periodic recalibration.

It is therefore an object of this invention to provide an improved electronic signal transducer of average responding RMS indicating type.

It is another object of this invention to provide an improved electronic signal transducer providing a highly accurate readout with excellent long term stability so as to require no periodic recalibration.

It is still another object of this invention to provide an improved electronic signal transducer suitable for use as a current transducer.

It is another object of this invention to provide improved electronic signal transducer suitable for use as a voltage transducer.

It is still another object of this invention to provide an improved electronic signal transducer having a transformer, inductively compensated voltage divider, active filter and output amplifying circuitry.

With these and other objects in view, which will become apparent to one skilled in the art as the description proceeds, this invention resides in the novel construction, combination, and arrangement of parts substantially as hereinafter described, and more particularly defined by the appended claims, it being understood that such changes in the precise embodiment of the herein disclosed invention are meant to be included as come within the scope of the claims.

BRIEF DESCRIPTION OF THE DRAWINGS

The accompanying drawings illustrate complete embodiments of the invention according to the best mode so far devised for the practical application of the principles thereof, and in which:

FIG. 1 is an electronic schematic of a basic prior art transducer device;

FIG. 2 is an electronic schematic of the current transducer of this invention;

DESCRIPTION OF THE INVENTION

Figure 3:
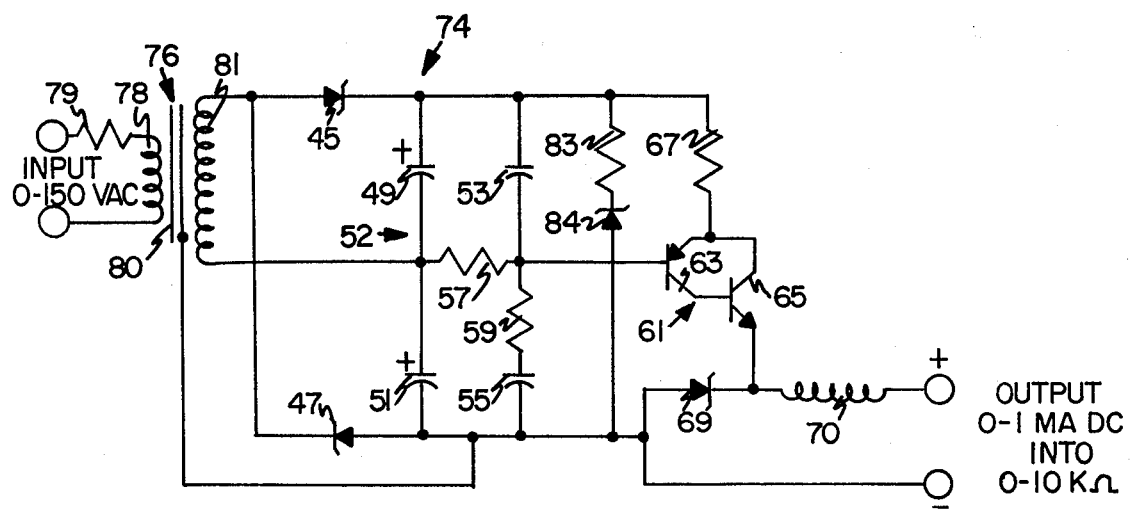
FIG. 3 is an electrical schematic of the voltage transducer of this invention.

Referring now to the drawings, FIG. 1 shows, in schematic form, a current transducer device 7 (and also shows in dotted form modification of the device for use as a voltage transducer) now known in the prior art, which basic circuit is utilized for example, in U.S. Pat. No. 3,971,979.

As shown, transformer 8 includes a primary winding 9 wound on core 10 for receiving an input (current or voltage depending upon the type of transducer), and a secondary winding 11 with winding 11 being also wound on core 10 and connected with a bridge rectifying circuit 13. Typically, transformer 8 has heretofore normally been a nickel-iron transformer of the laminated variety having one to four ounces of magnetic material, while primary winding 9 has four turns and secondary winding 11 had 9000 turns for a current transformer. The transformer isolates and scales the signal (nominally 5 amperes), while the rectifier performs absolute value detection rendering a DC signal with a superimposed 120 Hz AC ripple.

Secondary winding 11 (providing typically about 2 milliamperes of current) is connected with a filter capaciter 15 and with current mirror 17. As shown in FIG. 1, current mirror 17 includes reference and output sides, or legs, 19 and 21, with reference leg 19 being composed of a transistor 23 and collector and emitter connected resistors 25 and 27, and output leg 21 being composed of transistor 29 (while normally a plurality of transistors, only as a single transistor has been shown in FIG. 1 for simplicity) and emitter connected resistor 31. As shown, the bases of transistors 23 and 29 are directly connected with one another and are also connected with the collector of transistor 23. The filter (typically 6 to 40 microfarads) reduces the 120 Hz to a low level as well as providing a power source for the output when there is no input current during sign wave crossover, while the amplifier (included in the current mirror) is not only engaged in the filtering function but also amplifies the signal through the output so that variations in external loads do not cause variations in loading of the transformer. The current mirror (including the resistors) establishes the operating voltage of the secondary circuit of the transformer, while transistor 23 and resistor 27 (connected with the bridge rectifier) establish a reference voltage.

The emitter to base drop of transistor 29, added to the drop caused by resistor 31 must provide the same voltage and does so resulting in equal currents or approximately even currents in the reference and output legs of the transducer. This means that if approximately 2 milliamperes are provided to the current mirror, one-half (or one milliampere) is in the reference leg and the other one-half is in the output leg. The collector resistor 25 in the reference leg establishes the operating voltage of the output amplifier output circuit. Since the resistance is typically 10 to 15K ohms, and with a 1 milliampere signal, this establishes a 10 to 15 volt signal level as the maximum voltage which the amplifier can produce on the output terminals.

To modify the current transducer as shown in FIG. 1 to a voltage transducer, the input winding has a dropping resistor 33 (shown dotted in FIG. 1) added thereto and a high number of input turns to achieve approximately 20 ampere turns.

If a current mirror is provided with other than a 1 to 1 ratio, problems develop. When the ratio gets high (i.e. on the order of 10 to 1 or higher), a very large number of parallel connected output transistors are required to keep the base emitter voltage in the output leg matched to that in the reference leg. This is not only costly, but can also result in a situation where there is insufficient current available on the reference side to supply the needed base current for the output tranducers on the output side. As the ratio become higher, tolerance problems in matching resistors in the filter are reduced in proportion to the increase of the ratio so that at a rate of 10 to 1, there is an influence that is relatively small in proportion to the influence of the ratio of 1 to 1. The base current traveling through resistor 25, as shown in FIG. 1, for example, causes more voltage to develop across the output network than is calculated by resistor ratios. This voltage is in series with the input resistor (for a voltage transducer) and therefore the base current drastically affects the temperature coefficient level of the transducer if the ratio is well above 1 to 1. Even utilizing Darlington amplifiers, while high ratio current mirrors could be realized, accuracy and stability suffer. Thus, high ratio current mirrors that would not require calibration could not be attained utilizing prior art devices such as illustrated in FIG. 1.

It has been found that if the output side of a current mirror has added thereto a second transistor connected to amplify the output from the second (output) transistor that is utilized to track the base emitter voltage of the reference leg transistor, an increase in gain by the factor of the beta of the added transistor can be realized. This causes a reduction in the base current required to drive the transistor on the output side and makes it possible to go to very high ratios without creating as much instability as occurred with respect to prior devices. This makes it possible to provide a transducer that is free of any need for calibration and which is highly accurate, so as to be suitable for supplying a percent of reading performance over a range of operating conditions considerably wider than heretofore possible.

The base current present in a circuit such as shown in FIG. 1 also has a significant influence upon the voltage compliance available at the output terminals. The voltage is also determined by the combined tolerance and error of resistors in the circuit (which typically may be 6 to 15% influence in a circuit such as shown FIG. 1) so that the quality of voltage measurements is deteriorated. Accuracy can also suffer at low input levels unless very high beta resistors are utilized.

If, however, the reference ratio division is performed by the inductance of the transformer in conjunction with a voltage doubler then the accuracy of the transducer is enhanced even with low input levels. In addition, the voltage doubler can be utilized in a current transformer to reduce the available current by about one-half.

There is a significant advantage in this in that there is an optimal operating point for every size core that would be used in conjunction with this circuit, and for the smaller and lesser expensive cores this nominal number of turns may be quite high. For the core preferably used in this invention, the nominal desirable number of turns for highest accuracy is approximately 20,000 turns. The effect of using a voltage doubler type of arrangement is that this nominal operating point for the transformer, instead of requiring 20,000 turns and 1 milliampere (20 ampere turns) now requires only 9,000 turns and 2 milliamperes with good performance and impedance matching between the transformer and the output circuit being then achieved with fewer turns which results in a much lower transformer cost.

Utilizing the foregoing, a current transducer 35 of this invention is shown in FIG. 2. As shown, transformer 37 includes a core 39, primary winding 41 and secondary winding 43. It has been found preferable for primary winding 41 to have 4 turns and secondary winding 43 to have 8,993.5 turns (the half turn being for the convenience of the exit point for the secondary leads). Core 39 of transformer 35 is preferably a pot core, 30×19 millimeters, to eliminate core loss as a source of calibration error (a typical laminated nickel-iron transformer has a core loss which results in about one-half percent loss of signal from the primary to the secondary winding, which amount of loss is not stable with temperature or from one core to another, and therefore must be adjusted out and also must be allowed for relative to performance over a desired temperature range).

One side of secondary winding 43 is part of an inductively compensated voltage divider including Zener diodes 45 and 47 and capacitors 49 and 51. As shown, one side of secondary winding 43 is connected to opposite poles of Zener diodes 45 and 47. By utilizing Zener diodes (preferably 1N4756), the peak voltage coupled to the succeeding filtering and amplifying stages can be limited in the event of severe transients.

The other side of Zener diodes 45 and 47 are connected to one side of capacitors 49 and 51, respectively, and to one side of capacitors 53 and 55, respectively. As shown in FIG. 2, core 39 is also connected to the junction of diode 47 and capacitors 51 and 55.

The other side of capacitors 49 and 51 are connected with the other side of secondary winding 43, while the other side of capacitor 53 is connected with the junction of capacitors 49 and 51 through resistor 57, and the other side of capacitor 55 is connected to the junction of capacitor 53 and resistor 57 through resistor 59. Capacitors 49 and 51 preferably have a value of 6.8 microfarads (35 V), capacitors 53 and 55 preferably have a value of 0.1 microfarads (50 V), and resistors 57 and 59 preferably have values of 2.2 Meg ohms and 1.0 Meg ohms, respectively.

As shown in FIG. 2, output amplifier circuitry 61 includes a pair of transistors 63 and 65 (preferably 2N5087 and 2N5088, respectively) with the emitter of transitor 63 and the collector of transistor 65 being connected through resistor 67 to the junction of Zener diode 45 and capacitors 49 and 53. The base of transitor 63 is connected to the junction of capacitor 53 and resistors 57 and 59, while the collector of transistor 63 is connected to the base of transistor 65.

The emitter of transistor 65 is connected to the junction of Zener diode 69 and choke coil 70 with the other side of Zener diode 69 being connected to the junction of Zener diode 47 and capacitors 51 and 55, and the output from the circuit being taken from coil 70 and the junction of Zener diodes 47 and 69. Coil 70 provides current limiting for high frequency transients that could be present in utility applications. For this purpose, it has been found that a custom wound coil that is nominally 6.8 MH can effectively limit a 5,000 volt transient. Zener diode 69 (preferably 1N4750) protects the amplifier and capacitors from large transients and to accomplish this end, Zener diode 69 is preferably a surmetric Zener diode of approximately 14 volt and 1 watt rating.

Filter capacitors 49 and 51 acting in conjunction with diodes 45 and 47 and winding 43, provide an inductively compensated voltage divider, while capacitors 53 and 55, along with resistors 57 and 59, comprise the active filter compenents which work in conjunction with output amplifier 61 to provide a ratio between reference and output. Capacitors 49 and 51 are loaded by an effective impedance of 21 K ohms (which is twice the value of resistor 67 which is 10.5K ohms) thus providing a first filter, with resistor 57 and capacitor 53 providing a second filter so that the two filters together act as a two pole filter.

The output from the junction of resistor 57 and capacitor 53 drives output amplifier 61, and since the output amplifier current immediately affects the charge within the networks formed by capacitors 49 and 51, the feedback necessary to achieve active filtering performance is present.

Utilizing a filter as shown in FIG. 2, a 60 Hz ripple is superimposed on the DC signal (which is one-half the 120 Hz found for example, in the prior art circuit shown in FIG. 1). While capacitors 49 and 51 would together provide a 120 Hz ripple at the output of the capacitors taken together, each one has, in addition, a 60 Hz ripple since only one capacitor is charged at a time by the transformer. Since filtering such a 60 Hz ripple is difficult, resistor 59 and capacitor 55 inject a 60 Hz component into the circuit to reduce the 60 Hz component to acceptable values.

A voltage transducer 74 of this invention is shown in FIG. 3. As can be appreciated, the circuit components are the same (and have been so designated) except for transformer 76 which has an input winding 78 (that includes an input resistor 79) wound on a core 80 along with a secondary winding 81. Core 80 is preferably a 36×19 pot core, primary winding 78 has preferably 900 turns nominal, secondary winding 81 preferably has 6,000 turns nominal, and reistor 79 is selected to have a resistance of between 0 and 500 ohms. In addition, resistor 83 is connected in series with Zener diode 84 between the junction of Zener diode 45 and capacitors 49 and 53 and the junction of Zener diode 47 and capacitors 51 and 55. Resistor 83 is preferably 4.3 Meg ohms while Zener diode 84 is preferably a 1N753A.

Figure 4:
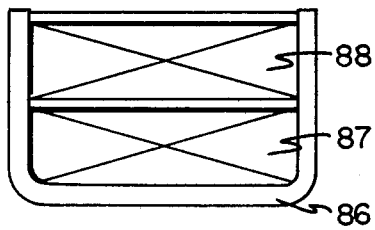
FIG. 4 is a cross-section of transformer windings illustrating the prior art.

As brought out hereinabove, the problem copper temperature coefficient significantly effects the temperature coefficient of a voltage transducer. FIG. 4 illustrates a typical cross section of a bobbin wound coil 86 used within the transformer of a typical voltage transducer. Bobbin 86 has only a predetermined area available for having wire wound thereon. The primary winding 87 requires about 42% of the total available winding area as a result has a resistance typically on the order of 200 ohms. The secondary winding 88 likewise requires about 42% of the total available winding area and as a result also has a reflected resistance typically on the order of 200 ohms. This results in about 400 ohms of impedance in series with the resistance at the primary (input) winding, and results in about 100 parts per million per degree centigrade temperature coefficient of the transducer due to the presence of copper.

Figure 5:
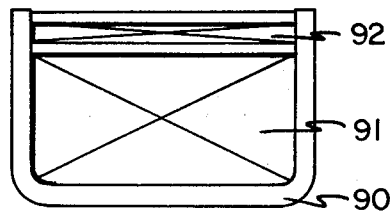
FIG. 5 is a cross-section of transformer windings that would be necessary utilizing the prior art system in this invention.
Figure 6:
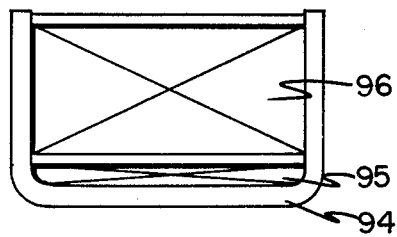
FIG. 6 is a cross-section of transformer windings according to this invention.

FIG. 5 illustrates a cross section of a bobbin 90 as would be required for the voltage transducer of this invention if copper wire were to be utilized. Since bobbin 90 has only a predetermined winding area, and, as shown, since primary winding 91 would require about 80% of the total winding area, there would insufficient room for copper wire to be used as secondary winding 92. So instead, resistance wire is utilized (also replacing the resistor in the primary winding) and use of such wire on bobbin 94 requires very little winding area for primary winding 95 (about 8%) as shown in FIG. 6. This leaves adequate winding room for the secondary winding 96.

Thus, the primary copper resistance is removed entirely, and the secondary copper resistance is reduced dramatically because of the increased available winding area. This results in a total resistance of about 120 ohms referred to the primary side instead of 400 ohms as in prior devices. This reduces the total temperature coefficience from approximately 100 parts per million per degree centrigrade to approximately 30 parts per million per degree centigrade.

As can be appreciated from the foregoing, a high ratio current mirror is achieved utilizing this invention as shown in FIGS. 2 and 3. The reference leg is formed by diodes 45 and 47, capacitors 49 and 51 and inductor 43 (the secondary winding of transformer 37), while the output leg is formed by transistors 63 and 65 and resistor 67.

The current transformer as shown in FIG. 2 operates in the following manner: Suppose that capacitor 49 has a substantially different voltage than capacitor 51. If it is presumed that 5 volts appears on capacitor 49 and 10 volts on capacitor 51, then during the half cycle when the transformer is charging capacitor 51, the voltage drop across the core will be substantially greater than it will be when the transformer is in the half cycle charging capacitor 49. The effect of this is to introduce a DC component flowing in the secondary winding of the transformer, and this DC current causes capacitor 49 to receive a much higher share of the available current than does capacitor 51. This results in the equalization of these two voltages, and that is the basis of the divider network operating. Available at the extreme opposite ends of the two capacitor networks are two voltages which will be essentially the same because of the equalizing effect of the inducter from which the AC charging current is coming (i.e. from transformer 37) and the two current available must be identical so long as there is no net DC drain on the junction of capacitors 49 and 51. The long term net current coming from the transformer must be AC since the transformer's one side is connected to a capacitor or capacitors and to negligible burden other than that.

The output from the active filter is coupled to the output amplifier circuit which operates in the following manner: Resistor 67 along with amplifiers 61 are the output load must all see the same current with the exception of the small amount required for bias current. If resistor 67 has a value of 10K ohms which results in 10 volts and approximately 10.7 volts with the diodes drop across capacitor 49, the equalizing characteristic of the reference leg in such that 10.7 volts will therefore be available across capacitor 51 and that determines the voltage available for the output. Amplifier 61 (made up of transistors) has the base of the drive transistor connected to the junction of the two capacitors 49 and 51 so that the drive transistor works in conjunction with the voltage divider to continuously maintain this condition. The ratio of the current traveling out of the output to the current traveling through resistor 67 is known to a high degree. They differ only by the DC burden present at the junction between capacitors 49 and 51 which is only the bias current required by the drive transistor. Presuming a very high beta for this transistor combination, the two currents would essentially be identical and the voltage supported by the transformer totally would be twice the voltage supported by a single side (the reference side) which would be determined primarily by resistor 67.

As shown in FIG. 2, the output from the active filter is coupled to the base of transistor 63 to drive transistor 63, which, in turn, drives transistor 65 since the collector of drive transistor 63 is connected to the base of output tansistor 65 and the emitter of drive transistor 63 is connected in common with the collector of output transistor 65. This substantially reduces the DC error resulting from the attachment of the bias current to the common point of the two capacitors. If transistors of nominal beta of greater than 200 are used, then the effective beta is over 40,000, and the error is less than 0.0025 percent, a negligable amount. This along with the high ratio provided by the high ratio output drive circuit, achieves an improved transducer that is a high ratio device that is accurate, stable and requires no calibration.

What is claimed is:

1. A transducer of the average responding RMS indicating type, said transducer comprising:
    transformer means having a primary winding for receiving an AC input signal and a secondary winding;
    inductively compensated voltage divider means connected with said secondary winding of said transformer means;
    filter means connected with said inductively compensated voltage divider means; and
    output amplifier means connected with said active filter means and providing an output signal accurately indicative of the magnitude of the AC input signal received at said transformer means.

2. The transducer of claim 1 wherein said transducer is a current transducer, and wherein said output amplifier means provides an output indicative of current variations received as said transformer means.

3. The transducer of claim 2 wherein said primary winding of said transducer means includes about four turns and said secondary winding includes about 8,993 turns.

4. The transducer of claim 1 wherein said transducer is a voltage transducer, and wherein said output amplifier means provides an output indicative of voltage variations received at said transformer means.

5. The transducer of claim 1 wherein said transformer means includes a ferrite core.

6. The transducer of claim 5 wherein said ferrite core is a pot core of dimensions no greater than about $36 \times 19$.

7. The transducer of claim 1 wherein said inductively compensated voltage divider means includes diode and capacitor means connected with said transformer means to provide a voltage doubler.

8. The transducer of claim 7 wherein said inductively compensated voltage divider means includes a first diode and a first capacitor connected across said secondary winding of said transformer means and a second diode and a second capacitor connected across said secondary winding of said transformer means, said diodes being reversed connected with respect to one another.

9. The transducer of claim 1 wherein said active filter means includes a pair of resistors and a pair of capacitors connected between said inductively compensated voltage divider means and said output amplifier means.

10. The transducer of claim 1 wherein said output amplifier means includes a pair of transistors to enhance gain with one of said transistors being connected to receive the output of the other of said transistors without incurring a base emitter drop for both of said transistors.

11. A magnitude responsive transducer, comprising:
    transformer means having a primary winding for receiving an AC input signal and a secondary winding;
    a current mirror having a reference side and an output side, said reference side including rectifier means and capacitor means that includes a pair of capacitors connected to said rectifier means, said reference side being connected with and acting in conjunction with said secondary winding of said transformer means, and said output side including a pair of transistors and a resistor; and output means connected with one of said transistors to provide an output accurately indicative of the AC input signal received at said transformer means.

12. The transducer of claim 11 wherein said rectifier means includes a pair of Zener diodes, and wherein said pair of capacitors are connected to said Zener diodes.

13. The transducer of claim 12 wherein the other of said transistors is connected to said capacitors, and wherein said one transistor is connected to receive the output of said other transistor without a base emitter drop.

14. A current transducer, comprising:
a transformer having an input winding for receiving a current variable input signal and a secondary winding;
first and second oppositely poled diodes connected with one side of said secondary winding;
a first capacitor connected with the other side of said secondary winding and with said first diode;
a second capacitor connected with the other side of said secondary winding and said second diode;
third and fourth capacitors connected in series with one another and with a first resistor, said third and fourth capacitors being connected to different ones of said first and second diodes;
a second resistor connecting said first and second capacitors to said third capacitor and said first resistor;
a first transistor connected with said second resistor to receive an input therefrom;
a second transistor connected to said first transistor to receive an the output therefrom;
a third resistor connected with said first diode and said first and second transistors; and
an output connected to said second transistor to provide a current responsive output from said transducer.

15. The transducer of claim 14 wherein said transducer includes a ferrite core and wherein said core is connected with said second diode.

16. The transducer of claim 14 wherein said first and second diodes are Zener diodes.

17. The transducer of claim 16 wherein said output includes a coil, and wherein a third Zener diode is connected between said coil and said second diode.

18. A voltage transducer, comprising:
a transformer having input winding for receiving a voltage variable input signal and a secondary winding;
first and second oppositely poled diodes connected with one side of said secondary winding;
a first capacitor connected with the other side of secondary winding and with said first diode;
a second capacitor connected with the other side of said secondary winding and with said second diode;
third and fourth capacitors connected in series with one another and with a first resistor, said third and fourth capacitors being connected to different ones of said first and second diodes;
a second resistor connecting said first and second capacitors to said third capacitor and said first resistor;
a first transistor connected to said second transistor to receive an input therefrom;
a second transistor connected to said first transistor to received the output therefrom;
a third resistor connected with said first diode and said first and second transistors; and
an output connected to said second transistor to provide a voltage responsive output from said transducer.

19. The transducer of claim 18 wherein said transducer includes a ferrite core winding and wherein said core is connected with said second diode.

20. The transducer of claim 19 wherein said input winding has a resistor connected thereto, and wherein said input winding has said resistor and resistance wire wound on said ferrite core.

21. The transducer of claim 18 wherein said first and second diodes are Zener diodes.

22. The transducer of claim 21 wherein said transducer includes a third resistor and a third Zener diode connected between said first and second Zener diodes.

23. The transducer of claim 21 wherein said output includes a coil, and wherein a third Zener diode is connected between said coil and said second diode.

* * * * *